United States Patent [19]

Hess

[11] 4,173,160
[45] Nov. 6, 1979

[54] MACHINE FOR CUTTING THE LEAD ENDS OF COMPONENTS MOUNTED AT PRINTED-WIRING BOARDS

[75] Inventor: Fritz Hess, Mettmenstetten, Switzerland

[73] Assignee: EPM AG, Zurich, Switzerland

[21] Appl. No.: 881,798

[22] Filed: Feb. 27, 1978

[30] Foreign Application Priority Data

Mar. 7, 1977 [CH] Switzerland ............... 2790/77

[51] Int. Cl.² ............................................. B26D 7/12
[52] U.S. Cl. ..................................... 83/174; 83/409.2; 83/435.1; 83/580; 51/247
[58] Field of Search ............ 83/174, 4, 580, 409.2, 83/435.1; 51/247, 248

[56] References Cited

U.S. PATENT DOCUMENTS

| 718,966 | 1/1903 | Grimm | 51/247 |
|---|---|---|---|
| 1,584,797 | 5/1926 | Neal | 83/4 |
| 2,121,062 | 6/1938 | Vincke | 83/174 X |
| 2,457,310 | 12/1948 | Judelshon | 51/247 X |
| 2,626,485 | 1/1953 | Waldbrauer | 51/248 X |
| 2,721,430 | 10/1955 | Green et al. | 51/248 |
| 3,167,983 | 2/1965 | Braun | 83/174 X |
| 4,072,077 | 2/1978 | Morgan | 83/409.2 |

Primary Examiner—J. M. Meister
Attorney, Agent, or Firm—Werner W. Kleeman

[57] ABSTRACT

A machine for cutting the lead ends of components mounted at printed-wiring boards, also referred to as printed circuits, comprising at least one rotating driven cutting disk, a grinding device for grinding such cutting disk, the cutting disk and the grinding device being relatively movable towards one another.

16 Claims, 2 Drawing Figures

1

MACHINE FOR CUTTING THE LEAD ENDS OF COMPONENTS MOUNTED AT PRINTED-WIRING BOARDS

BACKGROUND OF THE INVENTION

The present invention relates to a new and improved construction of machine for cutting the ends of leads or wires of printed-wiring boards, also known as printed circuits, at which there are mounted different types of components, and which machine is of the type comprising at least one rotating, driven cutting disk.

With such type machine the lead or wire ends protruding from the printed-wiring board at which there are mounted various standard electrical or electronic components, are cut to an adjustable length by means of cutting disks driven at high revolutions and arranged parallel to the printed-wiring board. The protruding lead or wire ends which are cut also encompass, apart from the leads of the mounted components, the remaining legs or the like of such components. Such type machine, depending upon the width of the printed-wiring board which is to be processed, possesses one or a number of cutting disks arranged in the same plane and in the throughpass direction of the printed-wiring boards, such cutting disks partially overlapping.

Due to the oftentimes hard material of the lead ends the cutting edges of the cutting disks are intensively loaded, so that with time these cutting edges no longer are sharp, and hence, the efficiency or output of the machine is limited. During continuous feed of the printed-wiring boards to be processed the pressure exerted upon the lead ends during the cutting operation increases with decreasing sharpness of the cutting edges. Consequently, there are produced irregular or unclean cutting locations, and, under certain circumstances, the lead or wire ends are even bent. To avoid these drawbacks it is necessary to regrind the cutting disks relatively frequently. For this purpose the cutting disks must be dismantled from the machine and exchanged for reground cutting disks. Oftentimes the exchange work also is associated with certain adjustment operations, so that, on the one hand, the machine must be stopped, and, on the other hand, the operating personnel must be employed for this additional work.

SUMMARY OF THE INVENTION

Hence, with the foregoing in mind it is a primary object of the present invention to provide a new and improved construction of machine for cutting the wire or lead ends of printed-wiring boards at which there are mounted components, in a manner not associated with the aforementioned drawbacks and limitations of the prior art proposals.

Another and more specific object of the present invention aims at the provision of a machine of the previously mentioned type wherein the time needed for grinding the cutting disks can be reduced to a minimum.

Still a further significant object of the present invention aims at the provision of a new and improved construction of machine for cutting the lead ends of components mounted at printed-wiring boards in a highly efficient, reliable and accurate manner, enabling the machine to be in use over a greater length of time, inasmuch as there can be avoided the need for exchanging dull cutting disks for resharpened cutting disks.

Now in order to implement these and still further objects of the invention, which will become more readily apparent as the description proceeds, the invention contemplates providing a grinding device for grinding the cutting disk, wherein the cutting disk and the grinding device can be advanced towards and relative to one another.

Such arrangement enables the regrinding or sharpening of the cutting disks, without the need to dismantle the same out of the machine. Consequently, there is avoided part of the primary work associated with the regrinding operation and present in the prior art machines, namely the dismantling of the cutting disks, the mounting thereof in a grinding device, the dismantling of the reground cutting disks out of the grinding device, the reassembly of the reground or sharpened cutting disks back into the machine and the possibly needed adjustment work. Hence, there is practically only needed the time actually required for the grinding or sharpening operation. By avoiding longer downtimes it is also possible to increase the efficiency or output of the machine.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
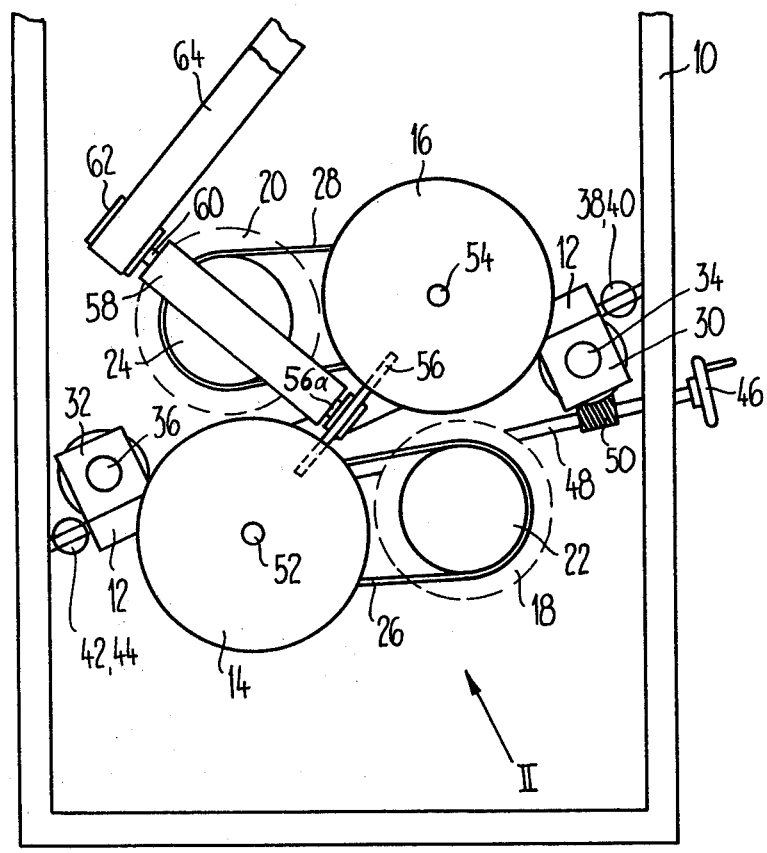
FIG. 1 is a top plan view of the machine for cutting the lead ends of components mounted at a printed-wiring board or printed circuit, illustrating two cutting disks and a grinding disk, while omitting for the sake of clarity in illustration the holder elements for the printed-wiring boards which are to be processed.

Describing now the drawings, in FIG. 1 there is shown a machine for cutting the lead or wire ends of components mounted at a printed-wiring board or printed circuit. In particular, in FIG. 1 a first cutting disk 14 is mounted by not particularly here visible bearings within a frame or housing 10 at one side of a carriage 12 and at the other side of such carriage there is mounted a second cutting disk 16, likewise by suitable bearings or the like which are not here visible. An electric motor 18 is operatively associated with the cutting disk 14 for driving the same during its cutting operation. Similarly, an electric motor 20 is operatively associated with the other cutting disk 16 for driving the same during its cutting operation. Each of the electric motors 18 and 20 carries a belt pulley 22 and 24, respectively, which are connected by means of the belts 26 and 28, respectively, or any other suitable power transmission elements, with a respective belt pulley, not particularly illustrated in FIG. 1, mounted upon the shaft of the related cutting disk 14 and 16 respectively.

The carriage 12 is connected at opposite ends thereof at each side with guide elements 30 and 32 by means of which this carriage 12 can be displaceably mounted for movement in vertical direction upon the two columns or uprights 34 and 36 respectively. Double-acting actuation cylinders 38, 40 and 42, 44 which are supported at the frame 10 and engage at each respective end of the carriage 12 can be provided as the actuation means for displacement of such carriage.

In order to adjust the lower stop for the carriage 12 there is provided a hand crank 46 or equivalent structure. The shaft 48 of this hand crank 46 is rigidly connected for rotation with two worms or the like, wherein in FIG. 1 only the worm 50 is visible. The further elements or parts of the adjustable stop or impact means will be considered more fully during the discussion of FIG. 2.

In the plane between the rotational axles or shafts 52 and 54 of the cutting disks 14 and 16, respectively, there is arranged a grinding disk 56, the shaft 56a of which is mounted in a stationary bushing or sleeve 58. The opposite end 60 of this shaft 56a, located remote from the grinding disk 56, carries a belt pulley 62. This belt pulley 62 is connected with drive motor 130, not particularly shown in FIG. 1, by means of a drive belt 64 or other appropriate power transmitting element.

Figure 2:
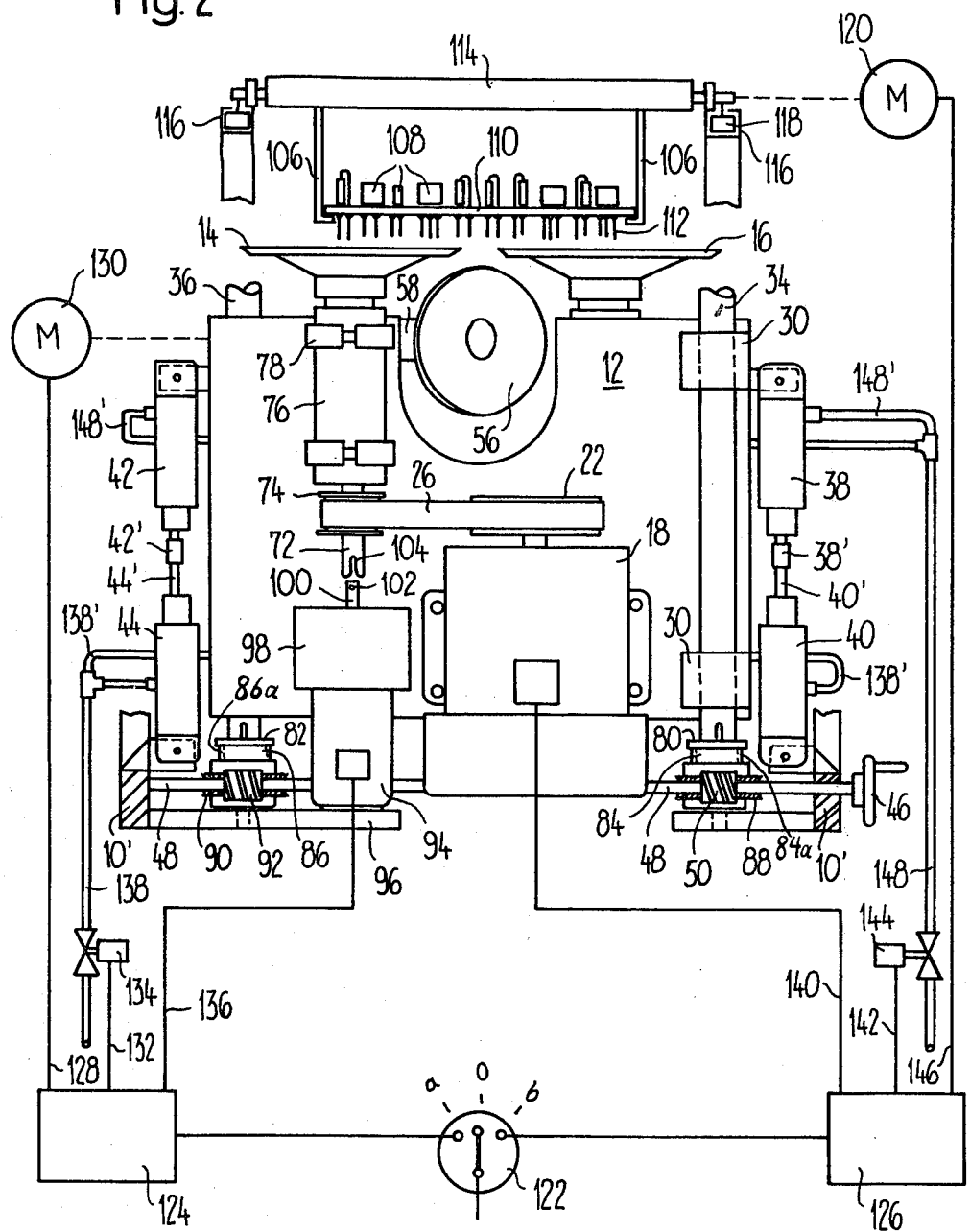
FIG. 2 is a side view, essentially looking in the direction of the arrow II of FIG. 1, however omitting the frames but showing the arrangement of a printed-wiring board which is to be processed.

FIG. 2 is a view looking essentially at right-angles with regard to the carriage 12 constructed as a plate and in the direction of the arrow II of FIG. 1. The electric motor 18 which drives the cutting disk 14 by means of its belt pulley 22, the belt 26 and a belt pulley 74 arranged at the spindle 72 of the cutting disk 14, is secured to the carriage 12. The spindle 72 of the cutting disk 14 is mounted in a bearing sleeve or bushing 76 which is attached by means of the connection or attachment elements 78 with the carriage 12.

At the side of the carriage 12 located forwardly in the showing of FIG. 2 there will be seen the guide elements 30 which are connected with such carriage 12 and guided at the right-hand side of such carriage at the top and bottom by the stationary column or upright 34. The guide elements 32 guided upon the left-hand located column 36 shown in FIG. 1 are disposed at the rear of the carriage 12.

The pneumatic actuation cylinders i.e. double-acting piston- and cylinder units 38 and 40 are interconnected with one another by means of their piston rods 38' and 40'. The lower cylinder 40 is supported at the frame 10', whereas the upper cylinder 38 is connected with the carriage 12. At the left-hand side of the showing of FIG. 2 the cylinders 42 and 44 are likewise interconnected with one another by means of their piston rods 42' and 44', whereas the lower cylinder 44 is mounted at the frame 10' and the upper cylinder 42 is attached to the carriage 12. The actuation cylinders 38, 40, 42 and 44 serve for raising the carriage 12 which supports the cutting disks 14 and 16.

The position of the carriage 12 shown in FIG. 2 is the null position in which the lower cylinders 40 and 44 have already been impinged with a pressurized fluid medium, such as typically compressed air. In this position the carriage 12 is raised in relation to the adjustable stops or impact members 80 and 82. These stops 80 and 82 are provided with bushings or sleeves 84 and 86 which are axially displaceable upon the columns 34 and 36, respectively, and which axially displaceable bushings 84 and 86 are provided with external threading, generally indicated by reference characters 84a and 86a respectively. The external threading 84a and 86a of the bushings or sleeves 84 and 86, respectively, meshes with not particularly visible internal threading within each of two worm gears 88 and 90 respectively. The worm 50 meshes with the worm gear 88 located at the right-hand side of FIG. 2, whereas a worm 92 meshes with the worm gear 90 located at the left-hand side of such Figure. Both of the worms 50 and 92 are rigidly connected for rotation with the shaft 48, and thus operatively connected with the hand crank or hand wheel 46.

A second electric motor 94 is stationarily arranged upon a baseplate 96 connected with the frame 10'. This motor 94 is fixedly connected with a speed reduction gearing 98, the power take-off shaft 100 of which is equipped with a coupling pin 102 or equivalent coupling structure. The power take-off shaft 100 is in alignment with the spindle 72 of the cutting disk 14. The end of the spindle 72 confronting the power take-off shaft 100 is hollow and possesses a slot 104 for engaging rigidly for rotation with the coupling pin 102.

Above the cutting disks 14 and 16 there is arranged a printed-wiring board 110 at which there are mounted the components 108. The printed-wiring board 110 is mounted in a holder device or holder means 106. The wire or lead ends 112 which protrude below the printed-wiring board 110 must be cut-off. The holder device 106 is attached at a carriage or sled 114 or the like which is guided in rails 116. In order to drive the carriage 114 in the rails 116 there is provided a stationary traction motor 120 or other suitable drive. This traction motor 120 is operatively connected for instance by means of a chain 118 with the carriage 114 in order to appropriately propel such carriage or sled 114 in the rails or tracks 116. These rails 116 are arranged essentially parallel to the lengthwise extending sides of the frame 10 as shown in FIG. 1, in other words do not extend at right-angles to the plane of the drawing of FIG. 2.

To control the machine there is provided a hand-operated switch or switch means 122 which can be selectively switched into various positions, such as the position null, the position a for grinding, and the position b for cutting. In the position a the switch 122 is connected with a control device 124 and in the position b with a second control device 126. Connected with the control device 124 correlated to the grinding operation, is the grinding motor 130 by means of a line or conductor 128, a magnetic valve 134 by means of a line or conductor 132 and the second electric motor 94 by means of a line or conductor 136. The magnetic valve 134 is switched in such a way that when the hand-operated switch assumes the position null and b compressed air is delivered to the actuation cylinders 44 and 40 by means of the compressed air conduits or pipes 138, 138'. The grinding motor 130 and the second electric motor 94 connected with the gearing or transmission means 98 are only in operation when the switch or switch means 122 assumes the position a. The grinding motor 130 drives the grinding disk 56 by means of the belt 64 (FIG. 1).

Continuing, the control 126 is operatively connected by means of a line or conductor 140 with the first electric motor 18, by means of a line 142 with a second magnetic valve 144 and by means of a third line or conductor 146 with the traction motor or drive 120. The second magnetic valve 144 is switched or operated such that only in the position b of the switch 122 is compressed air infed via the conduits 148, 148' to the actuation cylinders 38 and 42.

There will be now hereinafter explained in detail the function and operation of the machine. In the position null of the switch or switch means 22 the machine is ready for operation. The actuation cylinders 40 and 44 are pressurized and have lifted the carriage 12 into the position shown in FIG. 2. At non-illustrated upper stops or impact means for the carriage 12 there can be adjusted the length of the wire or lead ends which remain at the printed-wiring board following the cutting or severing operation. If the switch 122 is indexed into the position b, then also the upper actuation cylinders 38 and 42 are pressurized, which, in turn, raises the carriage 12 against the upper stop (not shown). The electric motors 18 and 20 drive the cutting or cutter disks 14 and 16 respectively. The traction motor or drive 120 runs, so that the carriage 114 suspended at the chain 118 or the like moves the printed-wiring board past the cutting disks 14 and 16 through a distance preselected by the non-illustrated stops. Due the action of the cutting or cutter disks 14 and 16, driven at a greater speed in relation to the rotational speed of the motors 18 and 20, the protruding lead ends 112 are cut to the desired length. Now one printed-wiring board after the other can be processed in analogous manner, without the need for shutting-off the drives.

If the cutting ability i.e. sharpness of the cutting disks 14 and 16 is diminished, then the switch 112 is indexed past the position null to the position a. By virtue of this switching operation the cutting motor 18 and the traction motor 120 are disconnected from their power source and are standstill. All of the actuation cylinders 38, 40, 42 and 44 are not pressurized, so that the carriage 12 together with the cutting disks 14 and 16 are lowered up to the stop means or impact elements 80 and 82. During the lowering movement the spindle 72 is coupled by the coupling elements 102, 104 with the power take-off shaft 100 of the transmission gearing-motor arrangement 94, 98. The spindle (not visible in the showing of FIG. 2) of the cutting disk 16 is analogously coupled with a not particularly illustrated transmission gearing-motor arrangement, which may be like that just discussed above. The transmission motor 94 and the grinding motor 130 have power applied thereto. By means of the transmission gearing-motor arrangement 94, 98 the cutting disk 14 is driven at a low rotational speed. The grinding motor 130 drives the grinding disk 56 onto which there are lowered the cutting disks 14 and 16 together with the carriage 12. The cutting disks 14 and 16 which rotate slowly are now ground or sharpened by the grinding disk 56. By means of the hand crank 46, at which there can be finely adjusted the stops or impact elements 80, 82 with the aid of the worms 50, 92 and the worm gears 88, 90 in their elevational position, it is possible to set, for instance to one hundreth of a millimeter the amount by which the cutting disks 14 and 16 should be reground. The cutting motors 18 and 20, which do not have any voltage applied thereto, rotate slowly during the grinding operation since it is superfluous to declutch these motors owing to the low rotational speed during grinding. After completion of the grinding operation the hand-operated switch or switch means 122 is indexed again into the position B for the further work.

By virtue of the described arrangement it is possible for the entire work expenditure of the machine operator for regrinding the cutting disks to be essentially limited to the actuation of the switch 122 and undertaking the fine adjustment or setting at the hand crank 46. In contrast to the work expenditure described at the introductory portion of this disclosure and needed with the state-of-the-art machines for regrinding the cutting disks, it will be recognized that there is an appreciable saving in work time when practicing the teachings of the present invention. The work time therefore amounts to only a fraction of the work time which was heretofore needed as explained previously. The stops which have been set for the cutting lengths remain unchanged during the grinding operation.

The grinding disk is arranged such that the cutting operations are neither hindered or disturbed thereby. The grinding disk is always disposed at an inclined angle suitable for grinding, so that the setting of the grinding position needed when working with separate grinding devices as in the prior art, is here dispensed with. With the arrangement of two cutting disks in the cutting machine these cutting disks are simultaneously ground by a single grinding disk. Separate grinding devices of known construction, as a general rule, only allow the simultaneous grinding of a single cutting disk.

The direction of movement for advancing the cutting disks towards the grinding disk is opposite to the direction of advancing movement carried out for adjusting the wire lengths. Consequently, a freedom of movement of the cutting disks in a single plane is satisfactory for fulfilling both operations, namely grinding and cutting. The two cutting disks which are arranged symmetrically with respect to one another and in relation to the grinding disk at a carriage affords a uniform load distribution at the carriage, and hence, there are not applied any forces to the carriage which could cant or tilt the carriage at the supporting columns.

By means of the second motor and the gearing and which motor can be decoupled during the cutting operation, the high speed cutting operation is not hindered in any manner. Due to the axial engageable and disengageable coupling means for interconnecting the spindle of the cutting disk with the speed reduction gearing there is employed the advancing movement of the cutting disk at the grinding disk, so that for the coupling operation there is not required any additional movement and also no additional actuation element.

While there are shown and described present preferred embodiments of the invention, it is to be distinctly understood that the invention is not limited thereto, but may be otherwise variously embodied and practiced within the scope of the following claims.

What I claim is:

1. A machine for cutting the lead ends of components mounted at a printed-wiring board, comprising:
   at least one rotatable cutting disk;
   means for driving said cutting disk;
   a grinding device for grinding said cutting disk;
   means for enabling said cutting disk and said grinding device to be advanced in relation to one another;
   said grinding device comprising a grinding disk;
   said cutting disk having a pair of oppositely situated faces;
   one of the faces of said cutting disk being located in confronting neighboring relationship to the printed-wiring board which is being processed;
   the other of said faces of said cutting disk being directed away from said printed-wiring board;
   said enabling means including means mounting said grinding disk adjacent said cutting disk at the side of the face of said cutting disk which is directed away from the printed-wiring board to be processed;
   the plane containing the grinding disk being arranged at least approximately at right angles to the plane containing the cutting disk;
   said rotatable cutting disk including a rotational shaft defining an axis of rotation for the cutting disk;

said axis of rotation being disposed at least approximately in the plane containing the grinding disk;
means for stationarily mounting said grinding disk;
said enabling means including structure for advancing said cutting disk downwardly in axial direction towards said stationarily mounted grinding disk.

2. The machine as defined in claim 1, wherein:
said cutting disk defines a first cutting disk;
at least one further cutting disk defining a second cutting disk;
said second cutting disk being arranged in a plane containing the first cutting disk;
said first and second cutting disks being symmetrically arranged with respect to said grinding disk.

3. A machine for cutting the lead ends of components mounted at a printed-wiring board, comprising:
at least one rotatable cutting disk;
means for driving said cutting disk;
a grinding device for grinding said cutting disk;
means for enabling said cutting disk and said grinding device to be advanced in relation to one another;
said grinding device comprising a grinding disk;
said cutting disk having a pair of oppositely situated faces;
one of the faces of said cutting disk being located in confronting neighboring relationship to the printed-wiring board which is being processed;
the other of said faces of said cutting disk being directed away from said printed-wiring board;
said enabling means including means mounting said grinding disk adjacent said cutting disk at the side of the face of said cutting disk which is directed away from the printed-wiring board to be processed;
the plane containing the grinding disk being arranged at least approximately at right angles to the plane containing the cutting disk;
said rotatable cutting disk including a rotational shaft defining an axis of rotation for the cutting disk;
said axis of rotation being disposed at least approximately in the plane containing the grinding disk;
said cutting disk defining a first cutting disk;
at least one further cutting disk defining a second cutting disk;
said second cutting disk being arranged in a plane containing the first cutting disk;
said first and second cutting disks being symmetrically arranged with respect to said grinding disk;
means for stationarily mounting said grinding disk; and
said enabling means including mechanism for advancing said first and second cutting disks in axial direction downwardly towards the stationarily mounted grinding disk.

4. The machine as defined in claim 3, wherein:
said advancing means includes a displaceable carriage at which there are mounted each of said first and second cutting disks;
column means upon which said carriage is displaceable.

5. The machine as defined in claim 4, wherein said advancing mechanism further includes;
pneumatic actuation means for displacing said carriage.

6. The machine as defined in claim 5, further including:
at least one stop means for fixing the carriage in a grinding position.

7. The machine as defined in claim 6, further including:
means for finely adjusting said stop means.

8. The machine as defined in claim 7, further including:
at least one further stop means for determining the length of the lead ends remaining at the printed-wiring board during the cutting thereof;
said carriage being movable into a cutting position which is opposite said grinding position;
said cutting position of said carriage being adjustable at said further stop means.

9. The machine as defined in claim 8, further including:
means for rendering the pneumatic actuation means effectual from a null position at the region between the two stop means which are located opposite one another, starting in the direction of the grinding position, as well as also in the direction of the cutting position.

10. A machine for cutting the lead ends of components mounted at a printed-wiring board, comprising:
at least one rotatable cutting disk;
means for driving said cutting disk;
a grinding device for grinding said cutting disk;
means for enabling said cutting disk and said grinding device to be advanced in relation to one another;
said grinding device comprising a grinding disk;
said cutting disk having a pair of oppositely situated faces;
one of the faces of said cutting disk being located in confronting neighboring relationship to the printed-wiring board which is being processed;
the other of said faces of said cutting disk being directed away from said printed-wiring board;
said enabling means including means mounting said grinding disk adjacent said cutting disk at the side of the face of said cutting disk which is directed away from the printed-wiring board to be processed;
the plane containing the grinding disk being arranged at least approximately at right angles to the plane containing the cutting disk;
said rotatable cutting disk including a rotational shaft defining an axis of rotation for the cutting disk;
said axis of rotation being disposed at least approximately in the plane containing the grinding disk;
said cutting disk defining a first cutting disk;
at least one further cutting disk defining a second cutting disk;
said second cutting disk being arranged in a plane containing the first cutting disk;
said first and second cutting disks being symmetrically arranged with respect to said grinding disk;
a displaceable carriage at which there is mounted the the first and second cutting disks;
column means upon which there is movable said displaceable carriage;
said carriage comprising a plate-like member having opposite faces;
said two cutting disks being arranged in off-set relationship at respective ones of said opposite faces of said plate-like member.

11. A machine for cutting the lead ends of components mounted at a printed-wiring board, comprising:
at least one rotatable cutting disk;
means for driving said cutting disk;
a grinding device for grinding said cutting disk;

means for enabling said cutting disk and said grinding device to be advanced in relation to one another;

said driving means for driving the cutting disk including drive means for driving the cutting disk during the grinding operation at a smaller rotational speed than during the cutting operation.

12. The machine as defined in claim 11, wherein:

said drive means for driving the cutting disk during the grinding operation includes a declutchable speed-reduction gearing.

13. A machine for cutting the lead ends of components mounted at a printed-wiring board, comprising:

at least one rotatable cutting disk;

means for driving said cutting disk;

a grinding device for grinding said cutting disk;

means for enabling said cutting disk and said grinding device to be advanced in relation to one another;

said driving means for the cutting disk comprising a first electric motor effective during the cutting operation and a second electric motor effective during the grinding operation; and switching means for turning-on only one of both electric motors as a function of the momentary advanced position of the cutting disk and grinding disk relative to one another.

14. The machine as defined in claim 13, wherein:

said first electric motor is turned-off during the grinding operation and remains operatively coupled with the cutting disk; and speed-reduction gearing operatively associated with the second electric motor.

15. The machine as defined in claim 14, wherein:

said cutting disk is provided with a spindle;

an axial engageable and disengageable coupling means provided for the spindle for interconnecting said spindle with said speed-reduction gearing.

16. The machine as defined in claim 15, further including:

drive belt means for connecting the first electric motor with the spindle of the cutting disk.

* * * * *